US008264285B2

(12) United States Patent
Rylyakov et al.

(10) Patent No.: US 8,264,285 B2
(45) Date of Patent: Sep. 11, 2012

(54) METHOD AND APPARATUS FOR LOW LATENCY PROPORTIONAL PATH IN A DIGITALLY CONTROLLED SYSTEM

(75) Inventors: Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 1090 days.

(21) Appl. No.: 12/175,012

(22) Filed: Jul. 17, 2008

(65) Prior Publication Data

US 2010/0017690 A1 Jan. 21, 2010

(51) Int. Cl.
*H03L 7/00* (2006.01)

(52) U.S. Cl. .................. 331/16; 331/17; 331/34; 331/11

(58) Field of Classification Search ............ 331/11, 331/16, 14, 25, 1 A; 327/156
See application file for complete search history.

(56) References Cited

U.S. PATENT DOCUMENTS 5,910,753 A * 6/1999 Bogdan ............................ 331/17
7,750,701 B2 * 7/2010 Ainspan et al. ............... 327/159

* cited by examiner

*Primary Examiner* — Arnold Kinkead
(74) *Attorney, Agent, or Firm* — Tutunjian & Bitetto, P.C.; Anne V. Dougherty, Esq.

(57) ABSTRACT

A digitally controlled circuit and method includes an error input coupled to a proportional path. The proportional path includes a selector which directly receives the error input as a select signal. The selector receives a proportional control weight from a location other than the proportional path wherein the proportional control weight is input to a digitally controlled oscillator (DCO).

19 Claims, 5 Drawing Sheets

METHOD AND APPARATUS FOR LOW LATENCY PROPORTIONAL PATH IN A DIGITALLY CONTROLLED SYSTEM

BACKGROUND

1. Technical Field

The present invention relates to latency reduction is a digitally controlled circuit and more particularly to a method and apparatus for latency reduction in digital phase locked loops (DPLLs) and digital delay locked loops (DDLLs).

2. Description of the Related Art

A proportional path is an important component of a proportional-integral-derivative (PID) controller. Digital PID controllers are used in digital phase locked loops (DPLL), digital delay locked loops (DDLL), hard disk drive read channels, and many other control systems. Note that application of the proportional control is not limited to PID controllers, it can be a part of a far more general control system. It is well known that delay in the proportional path is detrimental to the overall performance of the system.

In analog control systems (charge pump PLLs, for example), this problem is typically addressed by utilizing dual-loop controls with a high-bandwidth proportional path. In digitally controlled systems, like DPLL, the problem of lowering latency in the proportional path is particularly important since processing (weighting and applying) of the proportional control typically requires a few clock cycles. It should be noted that, unlike other components of the control system (the integral or differential paths, for example), the proportional path does not depend on the history of the error detector output.

FIG. 1 illustrates an example of a proportional-integral (PI) loop filter in a DPLL. A digital phase-frequency error signal (ERROR) is first multiplied by the weight "P" of a proportional path by a multiplier 12. Then, the output is combined by an adder 14 with an integral path control I which is multiplied by with ERROR by multiplier 16 and integrated by integrator 18. The combined output is optionally scaled (Gain) and is finally applied to a digitally controlled oscillator (DCO) 20.

Each of these operations requires one or more clock cycles and increases latency in the proportional path. Various techniques can be used to lower the latency of the digital blocks in the signal flow from the error input to the DCO controls. However, the state of the art approach inherently has non-zero latency which cannot be reduced below a certain limit.

SUMMARY

A digitally controlled circuit and method includes an error input coupled to a proportional path. The proportional path includes a selector which directly receives the error input as a select signal. The selector receives a proportional control weight from a location other than the proportional path wherein the proportional control weight is input to a digitally controlled oscillator (DCO).

A digitally controlled circuit and method includes an error input coupled to a proportional path and an integral path. The proportional path includes a selector which directly receives the error input as a select signal. The selector receives a proportional control weight from a location other than the proportional path wherein the proportional control weight is input to a digitally controlled oscillator (DCO). The integral path includes a multiplier and integrator for processing an integrator weight for the DCO.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
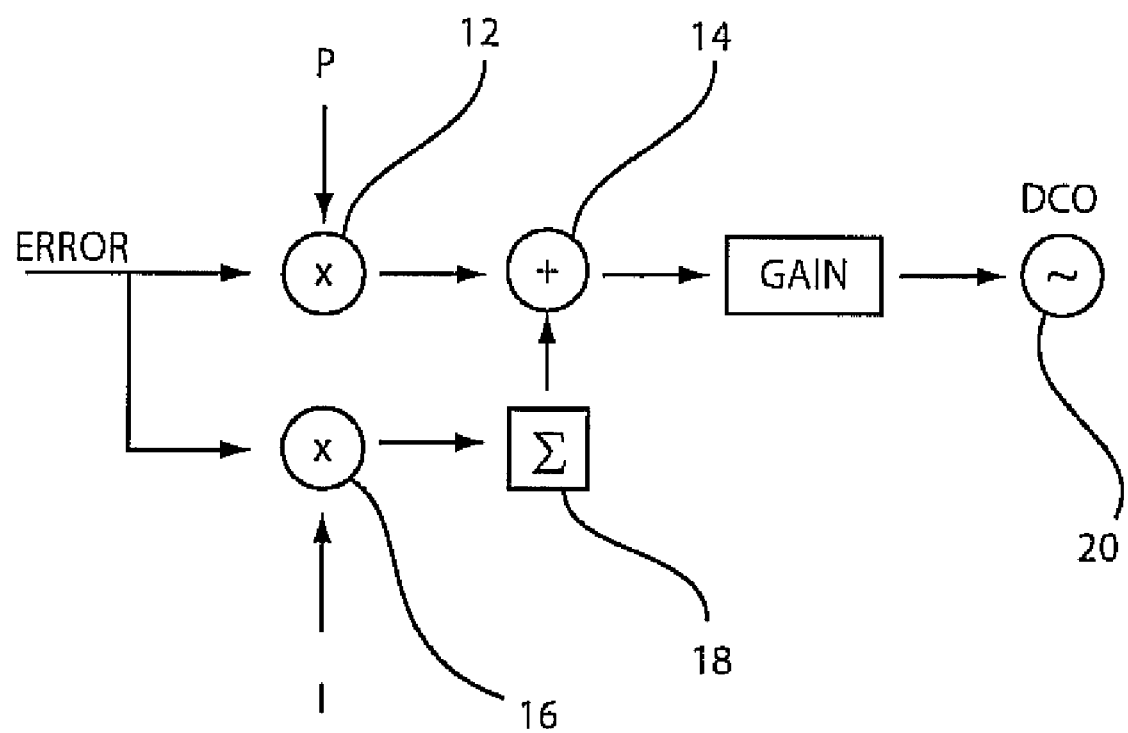
FIG. 1 is a schematic diagram showing a conventional proportional path in a digital phase locked loop circuit.

The present principles provide embodiments uniquely suited for a high-bandwidth, low latency implementation of proportional paths. A method of processing a proportional digital control in accordance with the present principles does not need multiple clock cycles to process (processing may be performed in one or less cycles), thus achieving virtually zero latency. The present principles apply the proportional control directly to a digitally controlled oscillator (DCO), weighting the error signal off the critical path and using the DCO structure itself as a final adder.

Embodiments of the present invention can take the form of an entirely hardware embodiment, an entirely software embodiment or an embodiment including both hardware and software elements. In a preferred embodiment, the present invention is implemented in hardware but may include software elements. Alternately, embodiments may be designed, modeled or otherwise implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

A circuit or apparatus as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
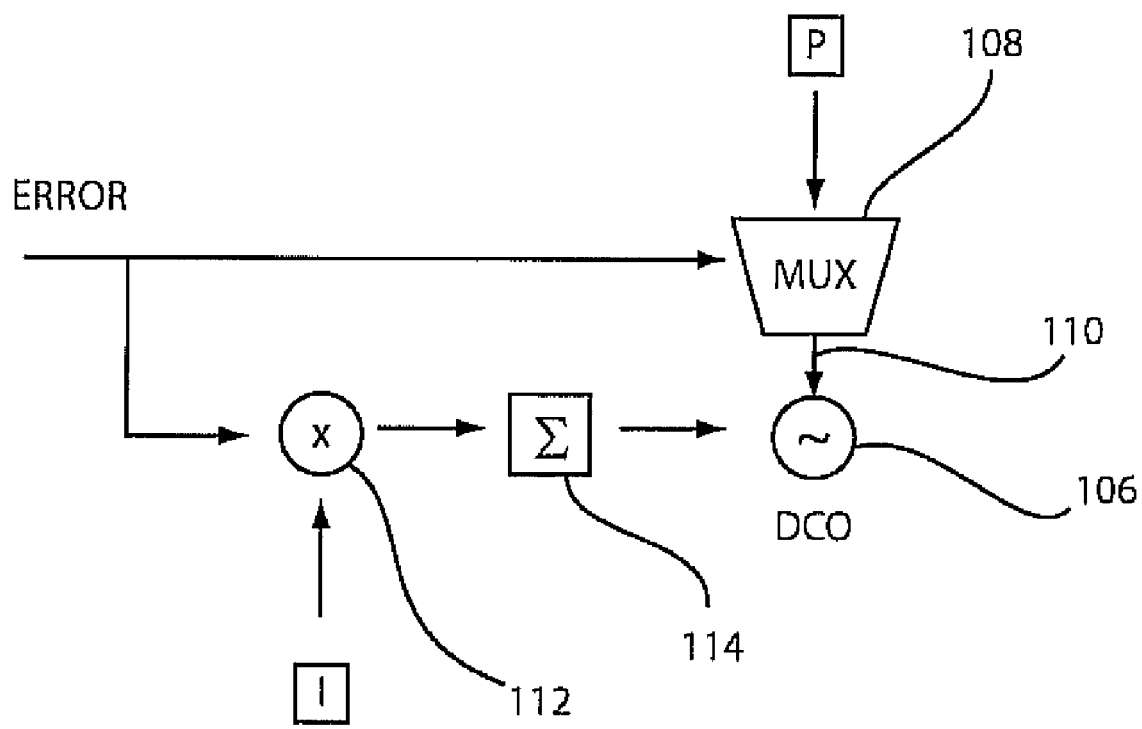
FIG. 2 is a schematic diagram showing a proportional path having a selector inputting a proportion control weight to a digitally controlled oscillator where the control is provided outside of the error input path (proportional path) in accordance with one embodiment.

Referring now to the drawings in which like numerals represent the same or similar elements and initially to FIG. 2, an illustrative schematic diagram of a circuit 100 with a low latency proportional path 102 is shown in accordance with one embodiment. The proportional path 102 may be a component of a proportional-integral-derivative (PID) controller. FIG. 2 illustrates an example of a proportional-integral (PI) loop filter in a digital phase locked loop (DPLL), although other circuits may be employed (e.g., a digital delay locked loop (DDLL), etc.). A digital phase-frequency error signal (ERROR) is input to two paths. The ERROR signal may be binary or non-binary. A proportional path 101 and an integral path 103 are shown. Proportional control is advantageously applied with near-zero delay, limited only by the time of flight from an error input 104 to a digitally controlled oscillator (DCO) 106 control.

In the case of a proportional-integral (PT) loop filter of a digital phase locked loop (DPLL), a proportional control (P) is weighted off the critical path (in this case from outside of proportional path 101) by using a selector 108 (or multiplexer (MUX)). Outputs of the selector 108 can be binary weighted or use some other encoding (e.g., thermometer input, etc.). A digital error signal (ERROR) is directly applied to a select input of the selector 108. The ERROR signal is also multiplied by I using a multiplier 112 and integrated with an integrator 114. The output of the selector 108 is based on already settled (static or slowly changing) bits of the "P" inputs. The output of the selector 108 is a resulting weighted proportional control signal 110 which is immediately applied to the DCO 106 (e.g., as soon as the error signal (ERROR) arrives, no clock signals are needed).

For example, the DCO 106 includes a plurality of elements used to control its output. The elements may include delay elements, capacitors, inverters or the like. The number of elements activated is in accordance with the value of P. If the ERROR signal is binary (0, 1 or −1, 1), the value of P may respectively by (0, P or −P, P). The ERROR signal enables the selector 108 to output the needed value of "P". The ERROR signal can be non-binary (or even analog) or include a binary word such that a more complicated output may be provided from selector 108. For example, the selector 108 may select values such as ½P, 3P, −5P, etc. depending on the application and the DCO adjustment needed. An output from the selector 108 may be proportional to a feature of the error signal such as its magnitude.

Internal structure of the DCO 108 then takes care of a final addition of the integral (I) and proportional (P) controls. Reduction of delay will automatically result in an increase in performance of a digitally controlled system. An additional benefit of this new approach is a reduction in complexity, power dissipation and area of a digitally controlled system.

Figure 3:
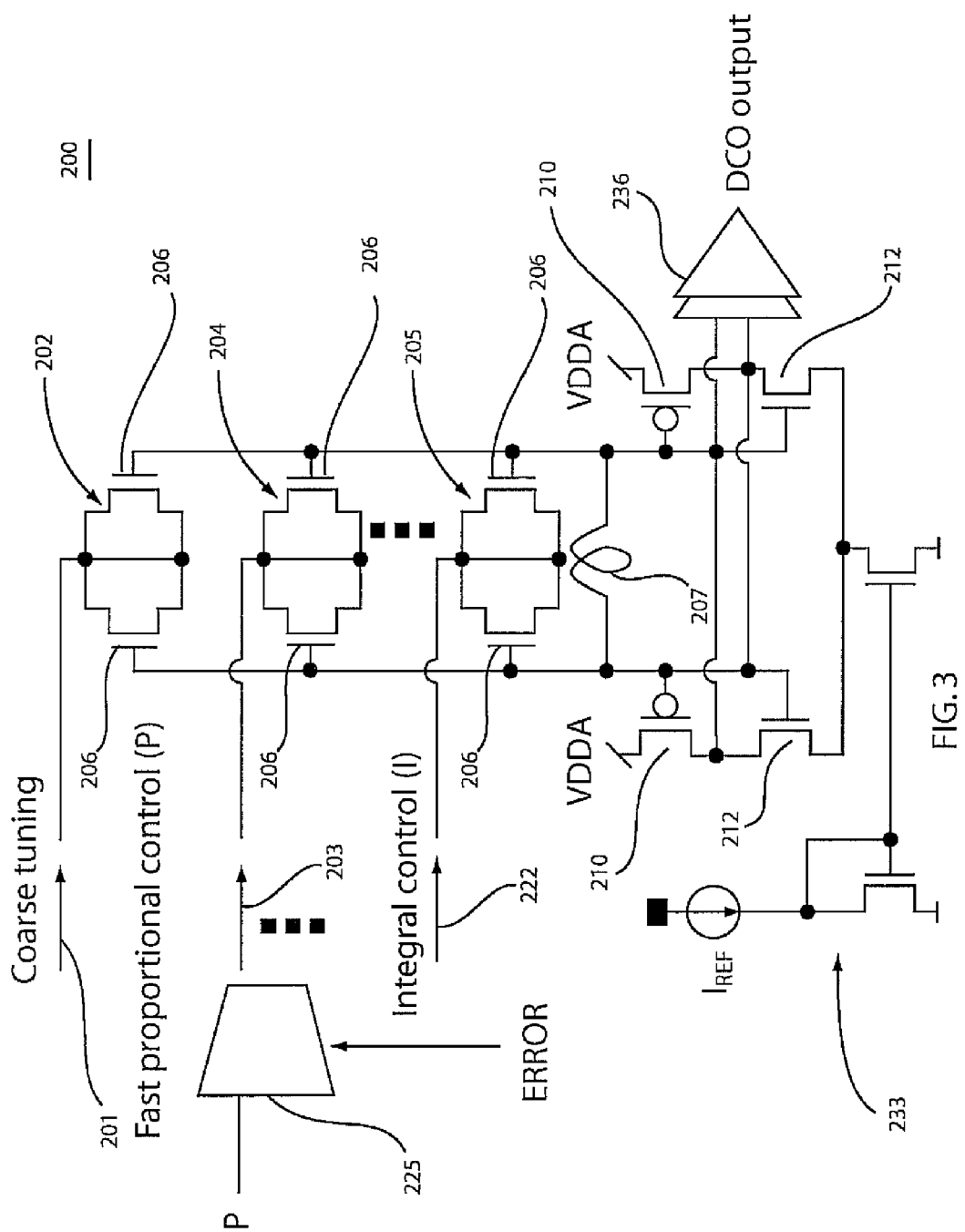
FIG. 3 is a schematic diagram showing an LC-Tank Oscillator circuit employing one embodiment in accordance with the present principles.

Referring to FIG. 3, an example circuit implementation of one illustrative embodiment is shown. A digitally controlled LC-tank oscillator circuit 200 is shown having a proportional control weight set by a choice of corresponding capacitors 202, 204 and 205. The capacitors 202, 204 and 205 are formed from NFET transistors (varactors) 206. Capacitors 202 and 204 are for course and fast control, respectively and capacitor 205 is for integral (I) control. An inductor 207 is employed in the LC circuit 200.

Control transistors 210 and 212, which are respectively PFETs (210) and NFETs (212) in this example, provide connections to power (VDDA) or ground. The addition of an integral control (I) 222 and proportional controls (course control 201 and fast control 203) is performed by DCO dynamics and a DCO 236 is controlled using the controls 201, 203 and 222. Tail current is limited by a tail current limiting circuit 233.

Fast proportional control 203 changes a capacitance value of varactors 206 and that in turn changes the overall frequency of the LC-tank oscillator. Since the resonance frequency is set by the total L and total C of the tank, the addition of the capacitance controls what happens inside the DCO 236 with little or no latency. Weighting of the proportional path gain is done by selecting the number of and/or sizes of capacitors 204 and/or varactors 206 to which the fast proportional control 203 is applied. This is provided by employing a selector 225, which is responsive to an ERROR signal (or other signal). In accordance with the ERROR signal, a number (e.g., P) of capacitors 204 are activated to control the DCO 236 with little or no latency.

Another example includes a ring-oscillator based DCO, where the frequency tuning is achieved by either controlling the strength of the core delay elements or by simply turning on and off tri-state inverters. In other words, instead of a number of capacitors being activated as in FIG. 3, a number of inverters (e.g., tri-state inverters) are activated. In a ring-DCO, the fast proportional path control is applied directly to tri-state inverters inside the DCO. The gain of the proportional path is set by selecting how many tri-state inverters in the DCO are controlled by the proportional path and/or by the relative sizes of those inverters. The tri-state inverters are connected at the input and output to the main DCO phases thus directly contributing to the delays in the ring oscillator and changing its frequency. Similar to the LC-tank DCO example above, the addition of the effects of the integral and proportional paths controls what happens inside the DCO in an analog manner with virtually no delay, and no special digital hardware to achieve the effect of addition.

The present invention is not limited to a particular implementation of a proportional path control in a phase-locked loop. One extension is a microprocessor clock management unit, which is dynamically controlled by a critical path monitor (CPM). The CPM-based control can be realized as a PID-control, with the proportional path control using the absolute minimum delay. The DCO can have several fast proportional control inputs, differently weighted and representing different control loops.

Another example includes a DPLL system with DCO being controlled by several (two in this example) different control blocks (e.g., a Loop Filter and CPM Compensation), each representing various parts of different PID control systems. Note that the combined effect of all those controls is added in the DCO, in an analog manner and allows the fast proportional path implementation for each of these PID controls.

Figure 4:
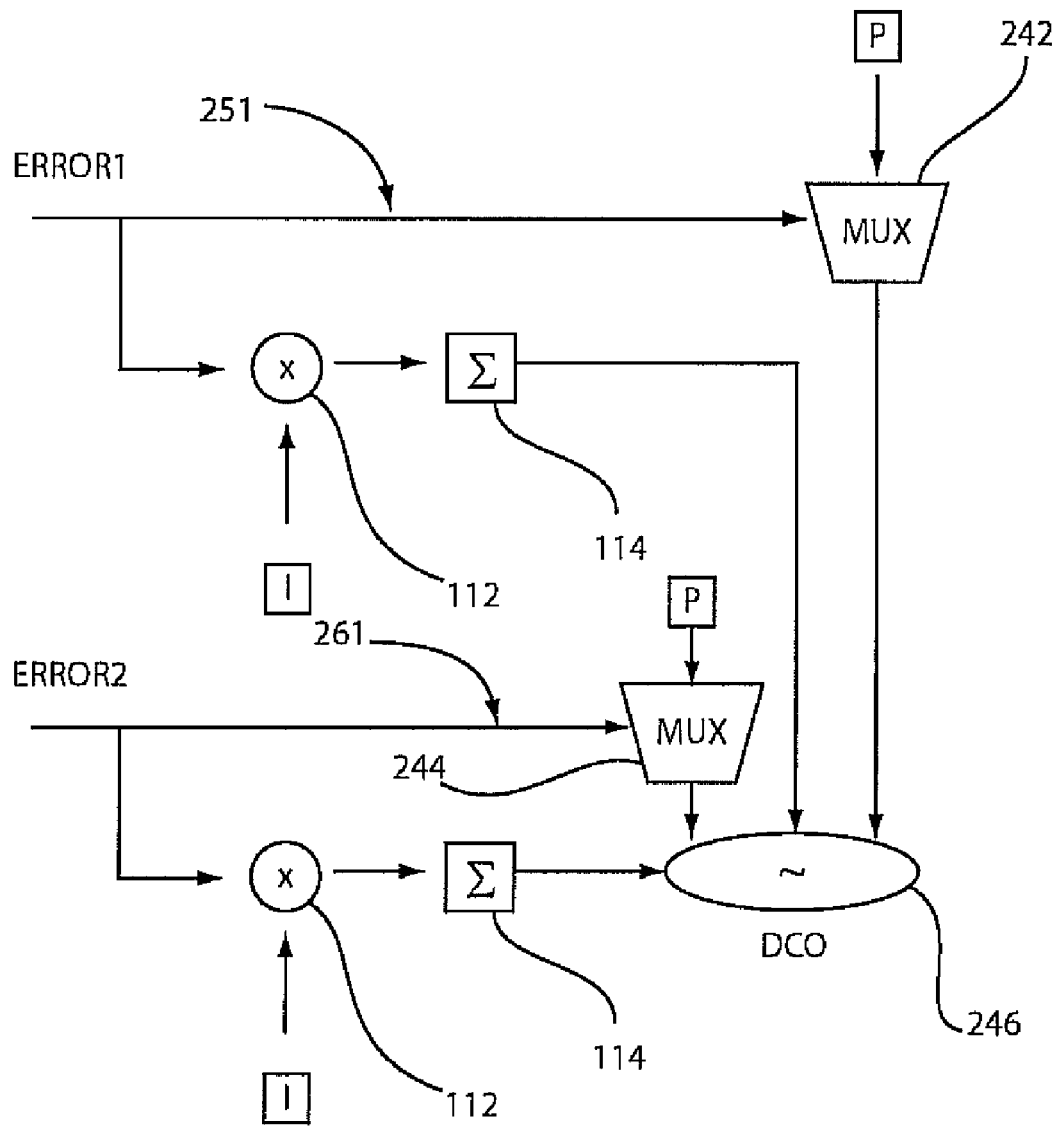
FIG. 4 is a schematic diagram showing a plurality of fast proportional paths in accordance with one illustrative embodiment.

Referring to FIG. 4, a schematic diagram shows an illustrative example of a circuit having a DCO 246 controlled by two (or more) control loops. An ERROR1 signal is employed to control a fast proportional path 251. A selector 242 selects a number of elements to activate in the DCO 246. An ERROR2 signal is employed to control a second fast proportional path 261. A selector 244 selects a number of elements to activate in the DCO 246. Each of paths 251 and 261 provide control of the DCO 246. The two paths 251 and 261 may have different time constants or provide different types of magnitudes of control. The outputs of selectors 242 and 244 may be combined or employed during different time periods of operation. Although two integration paths (I) are depicted, the two integration paths may not be needed.

Figure 5:
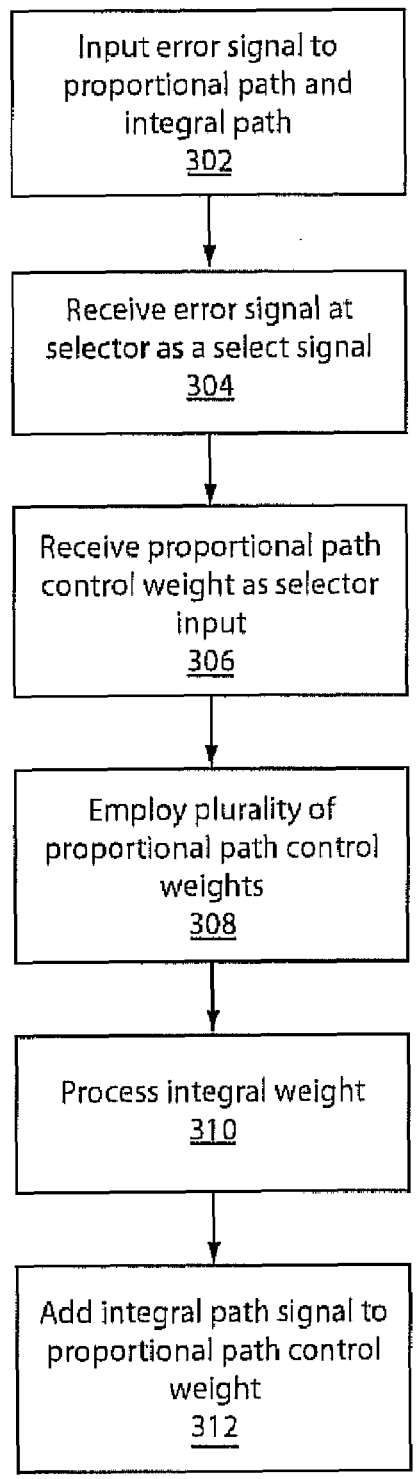
FIG. 5 is a flow diagram showing an illustrative method for reducing power dissipation, reducing latency and reducing circuit complexity digitally in accordance with one illustrative embodiment.

Referring to FIG. 5, a method for reducing latency and power dissipation in a digitally controlled circuit is illustratively shown. In block 302, an error signal is input to a proportional path and an integral path. In block 304, the error signal is received as a select signal for a selector. In block 306, a proportional control weight is received from a location other than the proportional path wherein the proportional control weight is input to a digitally controlled oscillator (DCO). The proportional control weight is input to the DCO with near-zero delay. The near-zero delay may include only a time of flight from the error input to the DCO. This may be, e.g., less than one clock cycle.

In block 308, a plurality of proportional control weights may be employed at the selector for input to the DCO. This depends on the design and the application of the circuit.

In block 310, an integral weight is processed on the integral path for the DCO. In block 312, the proportional control weight and an integral path signal are added in the DCO (e.g., the final addition). By providing, this structure at least one of latency, power dissipation and complexity are improved.

Having described preferred embodiments of a method and apparatus for low latency proportional path in a digitally controlled system (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A control circuit, comprising:
    an error input coupled to a proportional path and an integral path; and
    the proportional path including a selector which directly receives the error input as a select signal, the selector receiving a proportional control weight from a location other than the proportional path wherein the proportional control weight is input to a digitally controlled oscillator (DCO) with near-zero delay.

2. The circuit as recited in claim 1, wherein the near-zero delay includes only a time of transmission from the error input to the DCO.

3. The circuit as recited in claim 1, wherein the near-zero delay includes less than one clock cycle.

4. The circuit as recited in claim 1, wherein the circuit includes one of a phase locked loop, a delay locked loop, and a clock management unit.

5. The circuit as recited in claim 1, further comprising a plurality of proportional control weights for input to the DCO.

6. The circuit as recited in claim 1, wherein the DCO functions as an adder to incorporate the weights in an output.

7. A proportional-integral-derivative (PID) controller circuit, comprising:
    an error input connected to a proportional path and an integral path;
    the proportional path including a multiplexer which directly receives the error input as a select signal, the multiplexer receiving at least one proportional control weight from a location other than the proportional path wherein the at least one proportional control weight includes bits which are static or settled to provide near-zero delay of the at least one proportional control weight as input to a digitally controlled oscillator (DCO); and
    the integral path including a multiplier and integrator for processing an integrator weight for the DCO.

8. The circuit as recited in claim 7, wherein the near-zero delay includes only a time of transmission from the error input to the DCO.

9. The circuit as recited in claim 7, wherein the near-zero delay includes less than one clock cycle.

10. The circuit as recited in claim 7, wherein the circuit includes one of a phase locked loop, a delay locked loop, and a clock management unit.

11. The circuit as recited in claim 7, further comprising a plurality of proportional control weights for input to the DCO.

12. The circuit as recited in claim 7, wherein the DCO functions as an adder to incorporate the weights in an output.

13. A method for reducing latency and power dissipation in a digitally controlled circuit, comprising:
    inputting an error signal to a proportional path and an integral path;
    receiving the error signal as a select signal for a selector;
    receiving a proportional control weight from a location other than the proportional path wherein the proportional control weight is input to a digitally controlled oscillator (DCO) with near-zero delay; and
    processing an integrator weight on the integral path for the DCO.

14. The method as recited in claim 13, wherein the near-zero delay includes only a time of transmission from the error input to the DCO.

15. The method as recited in claim 13, wherein the near-zero delay includes less than one clock cycle.

16. The method as recited in claim 13, further comprising inputting a plurality of proportional control weights at the selector for input to the DCO.

17. The method as recited in claim 13, further comprising adding the proportional control weight and an integral path signal in the DCO.

18. The method as recited in claim 13, further comprising reducing one of latency, power dissipation and complexity by employing the proportional path.

19. The method as recited in claim 13, wherein the proportional control weight is input to the DCO according the select signal at the selector.

* * * * *